United States Patent [19]
Morris et al.

[11] Patent Number: 4,794,375
[45] Date of Patent: Dec. 27, 1988

[54] KEYBOARD CROSSPOINT ENCODER HAVING PSEUDO-N-KEY ROLLOVER

[75] Inventors: Lyle E. Morris, San Ramon; Chuo-Kee Bo, Cupertino, both of Calif.

[73] Assignee: Apple Computer, Inc., Cupertino, Calif.

[21] Appl. No.: 37,866

[22] Filed: Apr. 13, 1987

[51] Int. Cl.$^4$ .............................................. H04L 3/00
[52] U.S. Cl. ............................ 340/365 E; 340/365 S; 340/365 R
[58] Field of Search ............ 340/365 E, 365 R, 365 S; 364/709, 710; 400/477, 479

[56] References Cited

U.S. PATENT DOCUMENTS

| | | | |
|---|---|---|---|
| 3,892,915 | 7/1975 | Budworth et al. | 340/365 E |
| 4,106,011 | 8/1978 | Melanson et al. | 340/365 E |
| 4,211,915 | 7/1980 | Miller et al. | 340/365 E |
| 4,231,016 | 10/1980 | Ueda | 340/365 E |
| 4,420,744 | 12/1983 | Jesson | 340/365 E |
| 4,581,603 | 4/1986 | Ingold et al. | 340/365 E |
| 4,599,608 | 7/1986 | Matsuoka | 340/365 E |

FOREIGN PATENT DOCUMENTS 2162351 1/1986 United Kingdom .

OTHER PUBLICATIONS

"Solution to Phantom Key Problems"-IBM Technical Disclosure Bulletin-vol. 28, No. 5, Oct./85-pp. 1914-1919.
Bolt et al.,-"Phantom Key Detection/Phantom Key Scan Code"-vol. 27, No. 7A, Dec./84-p. 4109.

*Primary Examiner*—Marshall M. Curtis
*Assistant Examiner*—Mahmoud Fatahi-Yar
*Attorney, Agent, or Firm*—Blakely, Sokoloff, Taylor & Zafman

[57] ABSTRACT

A crosspoint encoder having a n-key rollover data collection system in which all keystrokes are recognized. A phantom key detection routine detects phantom key conditions and provides for temporary storage of subsequent keystrokes until the phantom condition is removed thus ensuring uninterrupted recordation of all keystrokes.

7 Claims, 3 Drawing Sheets

PHANTOM CONDITION DETECTED

KEYBOARD CROSSPOINT ENCODER HAVING PSEUDO-N-KEY ROLLOVER

BACKGROUND OF THE INVENTION

1. Field of the Invention.

The invention relates to the field of electronic keyboards, and in particular to keyboard crosspoint encoders having n-key rollover and phantom key detection.

2. Prior Art.

The usual electronic keyboard used for data entry into a computer or similar object device typically contains a crosspoint encoder as the key operational part. The crosspoint encoder comprises a flexible membrane or switches for causing electrical contact between row and column lines of a keyboard. The row and column lines thus form a grid pattern with lines held apart so that there is normally no electrical connection at the intersections. When external pressure is applied to the membrane or a key at the points of intersection, electrical contact is achieved at the intersection between one row line and one column line of the encoder. The information entered on the keyboard by the operator is detected by a microprocessor, for example, which scans all possible row/column combinations which keys are depressed at any given time. The microprocessor's scanning cycle is at a rate much faster than that of the most proficient typist so that no data is lost in the scanning process.

Problems with data entry error begin to arise when two or more keys are depressed simultaneously. This so-called "rollover" situation may occur accidentally, as when the operator strikes between two keys rather than directly upon one key, or when a highly proficient typist hits a short burst of very high speed typing on familiar letter combinations such as "the," "-tion," and the like. There are essentially three methods for dealing with the rollover problem. In the first of these methods, referred to as "no rollover," only the first stroke is recognized and all other simultaneously depresed keys are ignored. This method is sometimes used in calculators, bank machines, and generally in applications where a large volume of numerical figures must be entered with a high degree of accuracy. The method is too limited, however, for use where high typing speed is important, as too much data will be lost when the keyboard is used by a proficient typist. In the second method, "two-key rollover," only the first two keys of a simultaneously depressed series will be recognized, and all others will be ignored. In high speed typing applications, this method is an improvement over the no rollover method, but still results in loss of data. In the third method, "n-key rollover," all depressed keys are recognized whether depressed in a discrete manner or simultaneously. This method is obviously the preferable one for high speed typing applications, but here a new problem known as "phantom key" is introduced.

The phantom key problem may be summarily described as arising whenever three keys in a semirectangular pattern on the encoder matrix are held down simultaneously. Because of a false current path through the three closed junctions corresponding to the three depressed keys, an encoder having n-key rollover will receive a signal indicating that the key corresponding to the fourth vertex of the rectangle is depressed when in fact that key is not depressed. A keyboard having n-key rollover and no phantom key protection therefore will report all four keys when only three were depressed.

Several methods for dealing with the phantom key problem have been described in the prior art. One involves the isolation of each switch from every other switch, for example, by means of a diode, thus eliminating the possibility of a false current path. This method is expensive and is not practical with a membrane encoder. Another alternative is to discard all data entered while the phantom condition exists. This means that the three keys involved in creating the phantom condition plus all others depressed during the same period will be ignored, with a consequent loss of both real and phantom data. Such systems have been described in varying degrees of refinement in U.S. Pat. Nos. 4,106,011, 4,231,016, and 4,581,603. Finally, a system is described in U.S. Pat. No. 4,420,744, in which only those keys contributing to the phantom condition are ignored, while subsequent data entered during the phantom condition is recognized. In this system, the remaining two keys in the phantom group are recognized when one of the three is released and the phantom condition is terminated. This method results in complete retention of data, but also gives an incorrect ordering of data where more keys are depressed while the phantom condition still exists.

SUMMARY OF THE INVENTION

A crosspoint encoder and a method of collecting data from it are described. The crosspoint encoder utilizes a n-key rollover data collection system in which all keystrokes are recognized regardless of whether the keys are depressed in a discrete manner or simultaneously. A microprocessor within the encoder contains a phantom key detection routine which detects the phantom key condition when it exists and halts the transmission of data. A buffer is created for temporary storage of ambiguous data and further data entered during the existence of the phantom condition. Data collection and recordation thus continues uninterrupted while the phantom key condition exists. When one of the phantom keys is released, the accumulated data is reported in the correct order.

DETAILED DESCRIPTION OF THE INVENTION

A keyboard crosspoint encoder is described. In the following discussion, the incorporation of the invention into this preferred embodiment is described in considerable detail. However, it will be obvious to one skilled in the art that the invention may be practiced in other embodiments. In other instances, well-known parts and methods have not been described in detail in order not to obscure unnecessarily the unique characteristics of the present invention.

Figure 1:
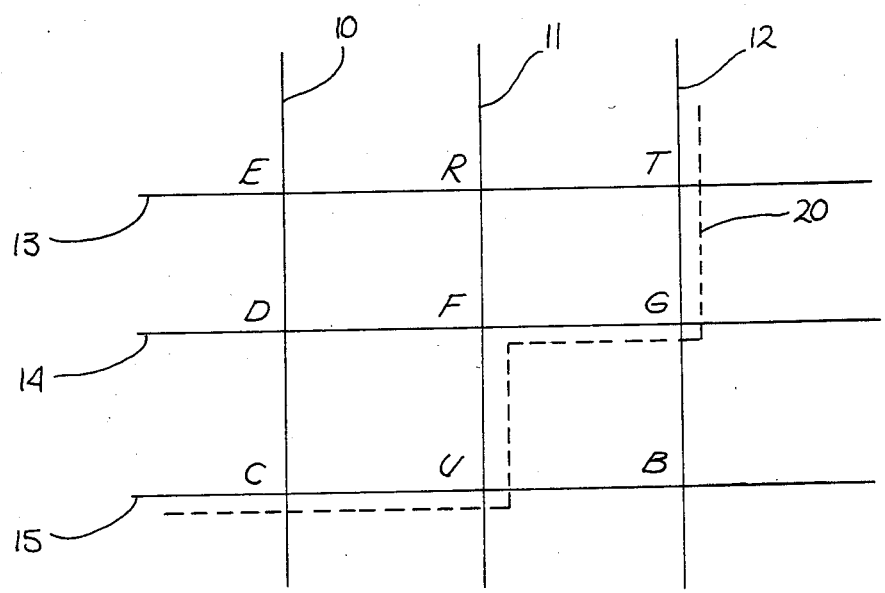
FIG. 1 is a diagram of a portion of an encoder illustrating its method of operation as well as the phantom key problem.

FIG. 1 is a schematic diagram illustrating the operation of a crosspoint encoder in a section of a typewriter keyboard. The generally parallel and spaced-apart column lines 10, 11 and 12 and the transverse generally parallel spaced-apart row lines 13, 14 and 15 are shown. The intersections of the lines are selectively coupled by typewriter key, and typical letters are illustrated at the intersection. Scanning operations determining which keys are depressed are performed by the microprocessor as is well known in the art. The specific voltages and order of this scanning is not critical to the present invention. The following discussion concerning FIG. 1 is for illustration of the problem of simultaneous keystrokes.

If, for example, only the key corresponding to the "C" intersection is depressed, the electrical continuity between column 10 and row 15 can be detected, either directly or through using a ground connection on the column or row lines. By scanning through all the column and row lines a microprocessor is often used to determine which keys in the matrix are depressed at a given time. An entire scan is performed in a time period much shorter than the keystrokes of even the most proficient typist.

Assume that "F" is depressed, this can be detected by the continuity between column 11 - row 14. Before "F" is released assume "G" is depressed, this is detected by the path between column 12 - row 14. Now assume that while both "F" and "G" remain depressed, "V" is struck. This can be detected via column 11 - row 15. However, with "F", "G" and "V" depressed a current path exists between column 12 - row 15 shown by dotted line 20. That is, it will appear that "B" is also depressed. Therefore, once "V" is depressed, the microprocessor will not be able to distinguish between "V" and "B". This is the phantom condition.

Figure 2:
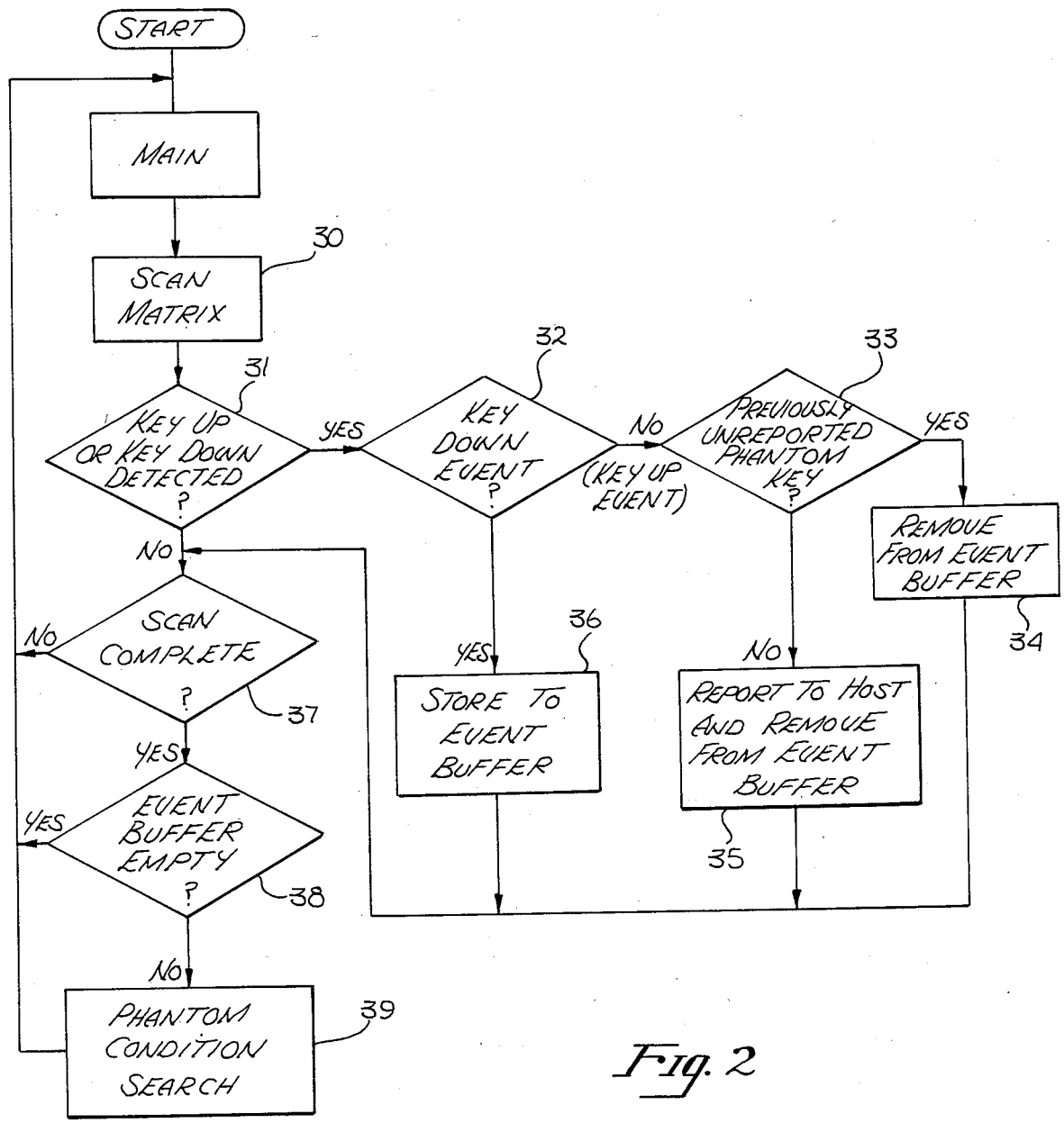
FIG. 2 is a flowchart illustrating the preferred method of the invention.

FIG. 2 is a flowchart illustrating the operation in the presently preferred embodiment of the invention for scanning the encoder matrix, storing keystroke events to an event buffer, and reporting data to the host computer. Scanning of the encoder matrix occurs at step 30 in a well-known manner.

At step 31, the microprocessor determines whether any "key up" or "key down" event has been detected. "Key down" events are stored to the event buffer at steps 32 and 36. At step 33, the microprocessor determines whether the "key up" event which has been detected corresponds to a previous "key down" event which was not reported to the host because the corresponding key was involved in a phantom condition. If the "key up" event does correspond to a previously unreported phantom key, the event is removed from the event buffer, step 34, and therefore is also not reported. If the "key up" event corresponds to a "key down" which was in fact previously reported to the host, or if the "key up" event is not from a key which is participating in a phantom condition, the keystroke event is reported to the host at step 35 and also removed from the event buffer. The detection of key up events at step 31 and the process performed at steps 33–35 are artifacts of the system utilized in the preferred embodiment, in which both "key up" and "key down" events are reported to the host computer. The present invention may readily be adapted for use in a system in which only "key down" events are reported. In such a system, the inclusion of steps 33–35 would not be necessary.

At step 37, the microprocessor determines whether the scan of the matrix has been completed. If not, the program recycles to the point labeled "main." If the scan is complete, the microprocessor inquires at step 38 whether any information is contained in the event buffer. If the event buffer is empty, the program recycles for another scan of the encoder matrix. If there is information contained in the event buffer, the microprocessor proceeds to subject this information to a phantom condition search at step 39.

Figure 4:
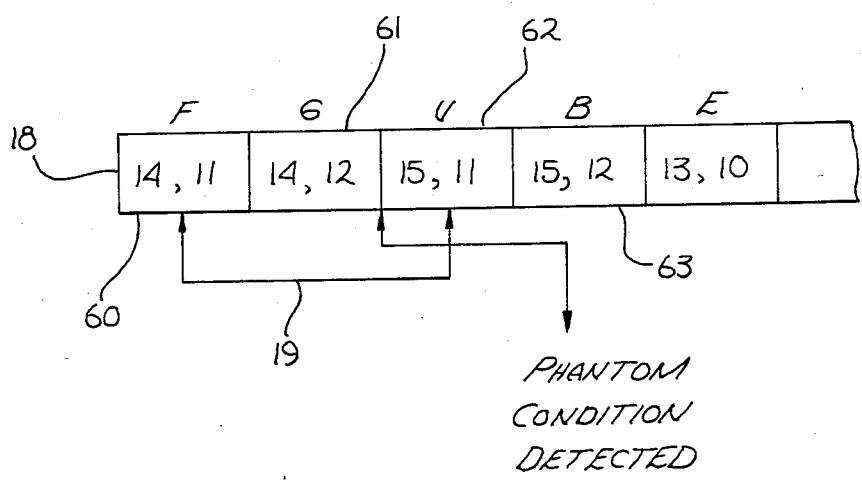
FIG. 4 is a diagram illustrating an event buffer and its contents.

This phantom detection is illustrated in FIG. 4. "F" is recorded as event 60 [14, 11] in buffer 18 (row 14, column 11) when "F" is depressed. Now if "G" is depressed, event 61 [14, 12] is next reported. When "V" is depressed, event 62 [15, 11] and event 63 [15, 12] are reported. However, the second occurrence of column 11, shown by bracket 19 with two current depressions in row 14, result in the phantom condition being detected. As will be seen below, "V" and "B" are requested as data when this condition is detected.

Figure 3:
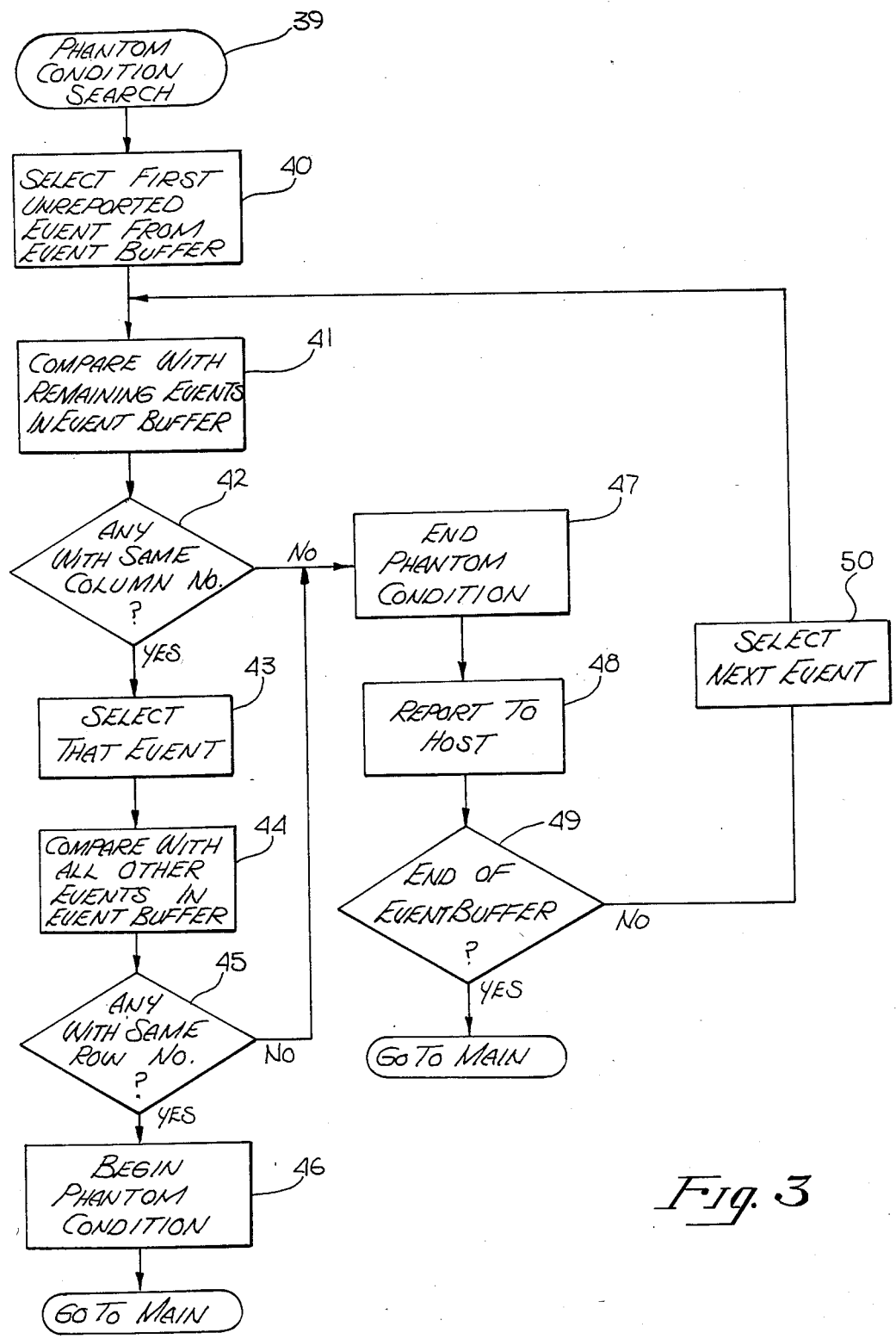
FIG. 3 is a flowchart illustrating the phantom condition search method.

FIG. 3 illustrates the operation of the phantom condition search program. The first previously unreported event contained in the event buffer is selected and compared with the remaining events in the buffer at steps 40 and 41. The microprocessor determines at step 42 whether any other event in the event buffer occurs in the same column as this first selected event. If so, that event is next selected at step 43. At step 44, this second selected event is compared with all events in the event buffer. Any keystroke event bearing the same row number as the second selected event are identified at step 45. If such an event exists, a phantom condition has been identified and the program recycles directly to "main" as indicated at step 46 without reporting data to the host.

If no events with the same column number as the first selected event are found at step 42, or if no events with the same row number as the second selected event are detected at step 45, then the phantom condition does not exist or has ceased to exist as indicated at step 47. In such a case, the selected keystroke event is reported to the host at step 48. At step 49, the microprocessor determines whether the search routine has reached the end of the event buffer. If so, the program returns to "main" for another scan of the keyboard. If the end of the event buffer has not been reached, the phantom search condition routine selects the next event in the buffer and recycles as indicated at step 50. It is possible that subsequent events in the buffer may indicate another phantom condition. If another phantom condition exists, it will be handled in the same manner as the previously described phantom condition.

Referring to FIG. 4, no reporting of data occurs as long as the phantom condition exists. Thus, if "E" is depressed, it is stored in the event buffer but not reported. When, by way of example, "F" or "G" are released the phantom condition no longer exists. "B" will be dropped from the buffer since it is no longer detected. "V" then "E" are now reported. Importantly, they are reported in the order that they were depressed.

The described invention provides a method for collecting data from a crosspoint encoder providing n-key rollover and phantom condition detection. When the phantom condition is detected, transmission of keystroke information to the host computer is suspended temporarily until the phantom condition has ended and the accumulated keystroke data is reported to the host computer in the correct order.

What is claimed is:

1. In a crosspoint encoder device, an improved method for the detection and solution of phantom key problems comprising the steps of:

(a) scanning rows and columns of an encoder matrix to determine a status of each switch in said matrix;

(b) creating a keystroke event buffer to store successive changes in said crosspoint switch status by storing said changes sequentially in order of occurrence;

(c) analyzing accumulated data in said event buffer for an existence of a phantom condition;

(d) halting the reporting of data to an object device when said phantom condition is detected;

(e) continuing to record incoming data and retaining such data in said event buffer until said phantom condition no longer exists;

(f) reporting a corrected data stream in an order recorded to said object device when said phantom condition ceases to exist;

whereby actual switch changes are presented correctly in the order of their occurrence.

2. The method of claim 1, wherein the step of analyzing said existence of said condition comprises the steps of:

(a) selecting a first key down event from said event buffer;

(b) comparing matrix coordinates, having a first and a second coordinate number of said first selected key down event with those of each other key down event in said buffer;

(c) selecting second key down event having a same second coordinate number as said first selected key down event;

(d) comparing matrix coordinates of said second selected key down event with those of all other key down events in said buffer; and, (e) identifying an existence of said phantom condition whenever another key down event in said buffer has a same first coordinate as said second selected key down event.

3. The method of claim 2, wherein said first coordinate number is a row number and said second coordinate number is a column number of said matrix.

4. The method of claim 2, wherein said crosspoint encoder device is of a type having a plurality of electrical switching elements arranged in a matrix of rows and columns.

5. The method of claim 1, wherein in the step (f), a corrected data stream is reported up to a possible second phantom condition when said first phantom condition ceases to exist.

6. In a crosspoint encoder device having a plurality of electrical switching elements arranged in a row and column matrix, an improved method for solving a phantom key condition, comprising the steps of:

(a) scanning rows and columns of said matrix to determine a state of each of said switching element;

(b) storing state changes of said switching elements in a storage buffer as events in the order of their occurrence;

(c) selecting a first event from said buffer by recording every key down event in the order of occurrence;

(d) comparing matrix coordinates, having a first and a second coordinate number, of said first selected event with those of all events stored in said buffer;

(e) selecting a second event having a same second coordinate number as said first selected event;

(f) comparing matrix coordinates of said second selected event with those of all other events stored in said buffer;

(g) identifying an existence of said phantom key condition whenever another event in said buffer has a same first coordinate number as said second selected event;

(h) continuing to store incoming switch state changes in said buffer until said phantom condition no longer exists;

(i) reporting said events present in said buffer after removal of said phantom condition;

(j) repeating steps (c) through (g) until said events in said buffer have processed for phantom conditions up to a point where a subsequent phantom condition is detected;

whereby actual switch changes are presented correctly in the order of their occurrence.

7. The method of claim 6, wherein said first number is a row number and said second coordinate number is a column number of said matrix.

* * * * *